United States Patent
Sim et al.

(10) Patent No.: US 8,355,251 B2
(45) Date of Patent: Jan. 15, 2013

(54) REMOTE EXHAUST FOR RACK SYSTEMS

(75) Inventors: Soon Peng Jason Sim, Singapore (SG); Foo Luen Wong, Singapore (SG); Siew Mei Koon, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 864 days.

(21) Appl. No.: 12/195,425

(22) Filed: Aug. 21, 2008

(65) Prior Publication Data

US 2009/0229810 A1 Sep. 17, 2009

Related U.S. Application Data

(60) Provisional application No. 61/034,167, filed on Mar. 6, 2008.

(51) Int. Cl.
*H05K 7/20* (2006.01)
*H05K 5/00* (2006.01)

(52) U.S. Cl. ............... 361/695; 361/679.5; 361/727; 454/184

(58) Field of Classification Search ............... 361/689, 361/690, 691, 694, 695, 679.48–679.5, 724–727; 454/184

See application file for complete search history.

(56) References Cited

U.S. PATENT DOCUMENTS

| | | | | |
|---|---|---|---|---|
| 6,048,099 | A | * | 4/2000 | Muffett et al. ............... 383/20 |
| 6,151,211 | A | * | 11/2000 | Dayan et al. ............... 361/690 |
| 6,280,318 | B1 | * | 8/2001 | Criss-Puszkiewicz et al. ............... 454/184 |
| 6,765,795 | B2 | * | 7/2004 | Modica ............... 361/695 |
| 6,882,531 | B2 | * | 4/2005 | Modica ............... 361/679.48 |
| 6,914,781 | B2 | * | 7/2005 | Rotta et al. ............... 361/690 |
| 7,486,511 | B1 | * | 2/2009 | Griffel et al. ............... 361/679.46 |
| 2004/0099747 | A1 | * | 5/2004 | Johnson et al. ............... 236/49.3 |
| 2005/0168945 | A1 | * | 8/2005 | Coglitore ............... 361/695 |
| 2005/0259392 | A1 | * | 11/2005 | Vinson et al. ............... 361/687 |
| 2006/0199505 | A1 | * | 9/2006 | Fettkether ............... 454/232 |
| 2007/0171613 | A1 | * | 7/2007 | McMahan et al. ............... 361/695 |

* cited by examiner

*Primary Examiner* — Zachary M Pape

(57) ABSTRACT

Embodiments of remote exhaust for dissipating heat in computers or other electronic devices are disclosed. An exemplary method may include coupling branch lines to each of a plurality of fan-less chassis in the rack system. The method may also include coupling the branch lines to at least one main line. The method may also include connecting the main line to at least one exhaust pump to remove heat generated in each of the plurality of fan-less chassis to a physically remote environment.

16 Claims, 3 Drawing Sheets

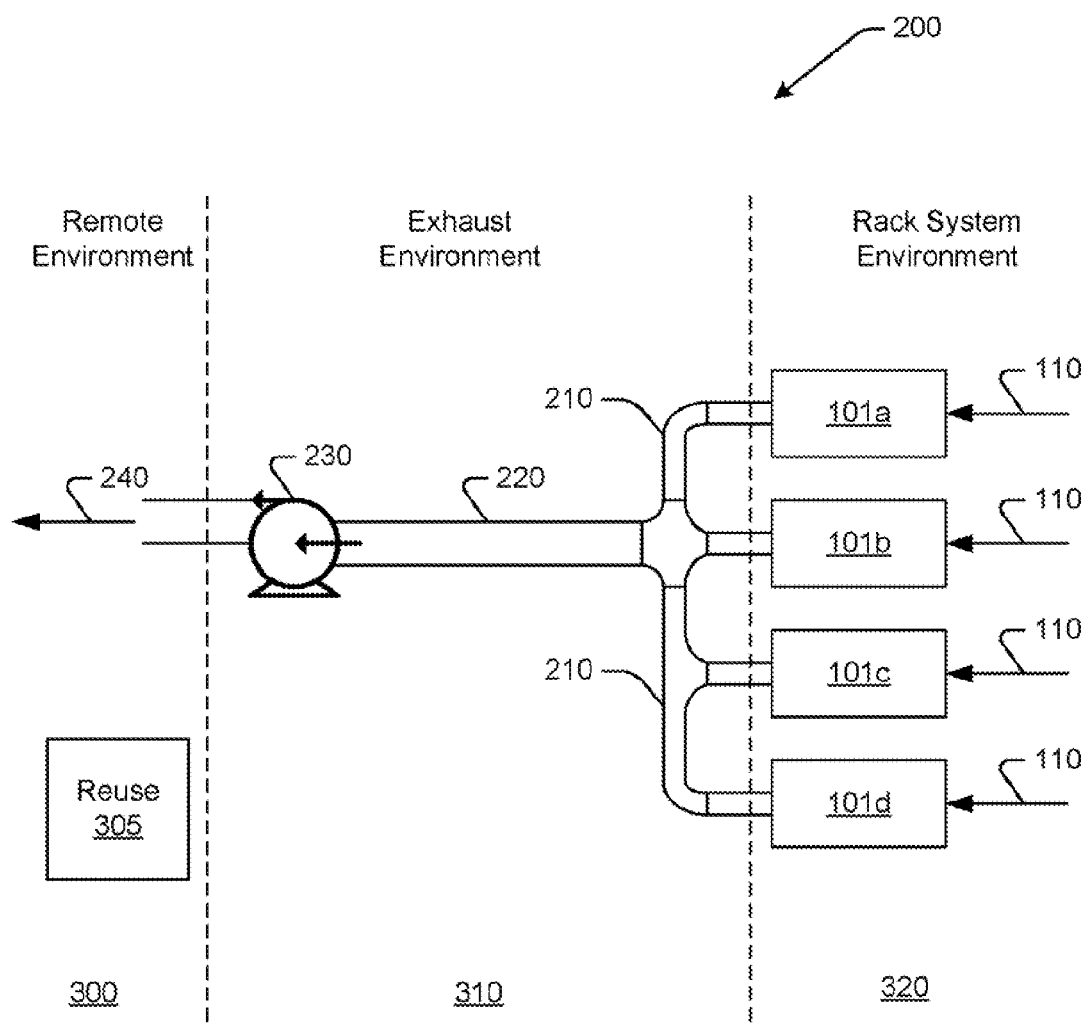

REMOTE EXHAUST FOR RACK SYSTEMS

CROSS REFERENCE TO RELATED APPLICATIONS

This Utility Patent Application is based on and claims the benefit of U.S. Provisional Application No. 61/034,167, filed on Mar. 6, 2008, the contents of which are hereby incorporated by reference in their entirety.

BACKGROUND

Computers and other electronic devices generate heat during operation. If not properly dissipated, heat generated during operation can shorten the life span of various electronic components and/or generally result in poor performance of the computers or other electronic devices.

Various thermal management systems are available, and typically include a heat sink and/or a cooling fan mounted on or directly adjacent the heat-generating component. In an exemplary computer configuration, the heat sink is positioned adjacent the electronic components generating the most heat (e.g., the processor) to absorb this heat. A cooling fan may then be positioned to blow air across the heat sink and out an opening formed through the computer housing to dissipate heat into the surrounding environment.

Sizing the heat sink and/or cooling fan to prevent overheating remains important during development of these systems. However, developers also have to consider cost, size constraints, and acoustics (e.g., noise generated by the cooling fan). In large rack-based computer systems, the number and/or size of fans needed to cool all of the components can make the room so noisy that technicians only enter the room on an as-needed basis (e.g., to make repairs, upgrades, etc.). In addition, the hot air removed by the fans lingers behind the component and can cause a general increase in room temperature.

BRIEF DESCRIPTION OF THE DRAWINGS

FIG. 3 is a high-level schematic view illustrating various environments of an exemplary remote exhaust system.

DETAILED DESCRIPTION

Briefly, exemplary embodiments of remote exhaust for rack systems disclosed herein may be implemented to dissipate heat in computers or other electronic devices. In an exemplary remote exhaust system, individual chassis in the rack system may be coupled by branch lines to a main line. One or more exhaust pump may be connected to the main line. The exhaust pump may be located to remove hot air from the chassis to a physically remote environment (e.g., outdoors). During operation, the exhaust pump draws cooler air through a front end of the chassis, past at least one heat-generating component (e.g., a processor, heat sink, etc.) in the chassis, and out the back of the chassis through the branch lines and main line to the remote environment.

Accordingly, the remote exhaust system efficiently dissipates heat from one or more heat-generating components to a remote environment, reducing the number of fans needed and thereby decreasing costs, increasing space available for components in the rack system, and improving acoustics. In addition, the exhaust pump may be isolated to further improve acoustics.

In exemplary embodiments, the air flow may be regulated and remotely controlled to customize the heat removal rate due to changes in operating conditions (e.g., number of components in the rack system) and/or operating temperature. The remote exhaust system may also be readily upgraded to accommodate different configurations and/or number of components of the rack system. In still other exemplary embodiments, the hot air may also be recycled (e.g., by reincorporating the hot air into the building's heating system, heating water, etc.).

Figure 1:
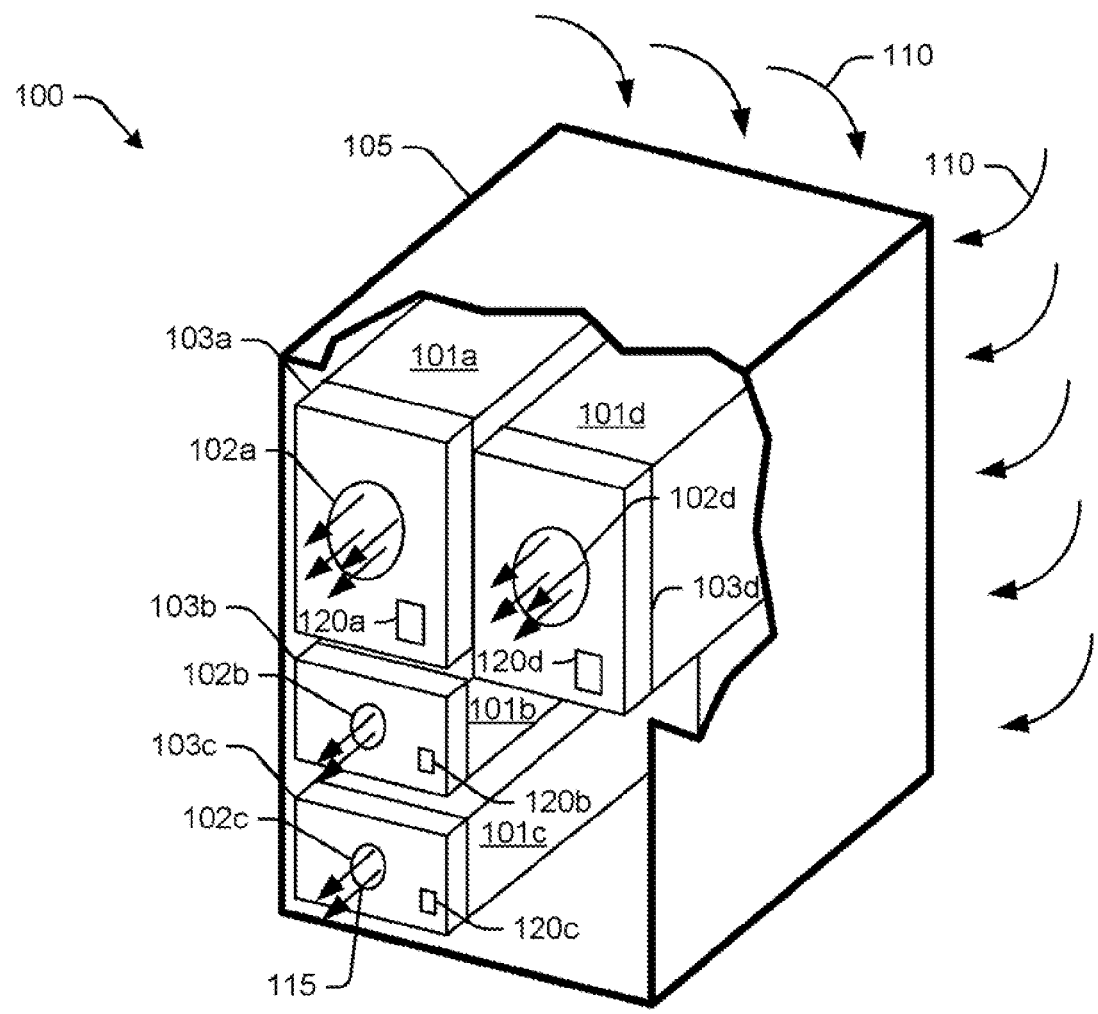
FIG. 1 perspective view of an exemplary rack system in which a remote exhaust may be implemented.

FIG. 1 perspective view of an exemplary rack system in which a remote exhaust may be implemented. It is noted, however, that the remote exhaust is not limited to use with any particular type or configuration of rack system, computer, or other electronic device.

Exemplary rack system 100 may include a plurality of chassis 101a-d mounted within a housing 105. The chassis 101a-d may be any suitable size enclosure and may be manufactured of any suitable material, such as, e.g., a plastic or metal enclosure suitable for mounting in the housing 105 of the rack system 100.

Each chassis 101a-d may house electronic and other heat-generating devices. For example, the chassis 101a-d may house a PC board including one or more processing units or processors and other devices and components mounted to, connected to, or positioned near the PC board. For example, rack mount servers may include data storage devices (e.g., hard disk drives, compact disc (CD) or digital versatile disc (DVD) drives, etc.) and operate in a communications network, and therefore include suitable network connection interface(s). Still other devices and components may also be mounted on or otherwise connected to the PC board, as is readily apparent to one having ordinary skill in the computer and electronic arts. During operation, one or more of these components (e.g., the processors) may generate heat.

In an exemplary embodiment, the back-end of the chassis 101a-d (e.g., the portion shown in FIG. 1) is sealed to the chassis 101a-d. For example, a seal 103a-d may be made of an elastic, heat-resistant material that conforms (e.g., wraps around) the back-end of the chassis 101a-d to facilitate movement of air through at least one air flow opening 102a-d formed in the back-end of the chassis 101a-d.

Figure 2:
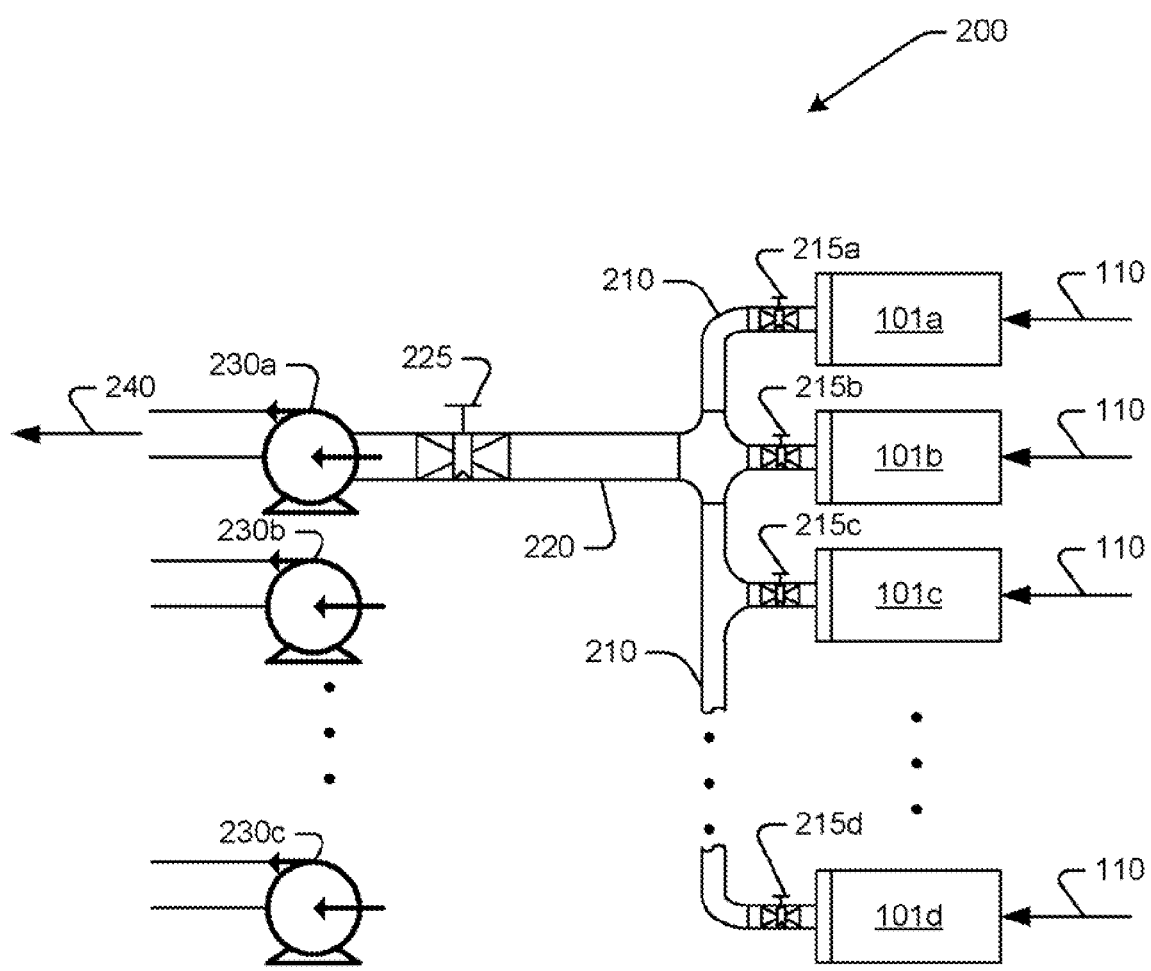
FIG. 2 is a schematic view of an exemplary remote exhaust system.

The front of the chassis 101a-d is open to allow air flow. Although not required, vents may also be provided on the sides of the chassis 101a-d to further facilitate the air flow. The at least one air flow opening 102a-d may be formed through the back-end, where the chassis 101a-d may be connected to a network of collection ducts, as can be seen in FIGS. 2 and 3. At least one remotely located exhaust pump (FIGS. 2 and 3) may be operated to draw air through a front portion of the rack system 100 (e.g., as illustrated by arrows 110 in FIG. 1), through the chassis 101a-d and out the air flow opening 102a-d formed through the back-end of the chassis 101a-d (e.g., as illustrated by arrows 115 in FIG. 1).

Drawing cooler air 110 through the front of the chassis 101a-d, past the heat-generating components and out the back-end of the chassis 101a-d functions to remove heat. As will be readily appreciated from the exemplary embodiments discussed in more detail below with reference to FIGS. 2-3, the remote exhaust system enables a fan-less chassis 101a-d and a larger footprint inside the chassis for installation of the electronic devices (e.g., on the PC board) than the footprint which would be available if a fan device also had to be installed inside the chassis 101a-d to provide comparable heat-removal capability. Likewise, more devices installed in the chassis 101a-d can be installed in the housing 105 of the rack system 100.

In exemplary embodiments, an access opening 120a-d may be provided in the back-end of the chassis 101a-d, e.g., through the seal 103a-d. The access opening 120a-d enables access for peripherals (e.g., power cords or other cables) and enables "online" maintenance (simple maintenance while the system is still running). A flap may be used to close the access opening 120a-d around the peripherals or when the access opening 120a-d is not in use. The flap may be secured to the seal 103a-d using a hook-and-loop fastener (e.g., Velcro®) or other suitable fastener.

Also in exemplary embodiments, one or more heat sink (not shown) may also be provided in the chassis 101a-d to aid in collecting heat and "wicking" the heat away from the heat-generating components and into the path of air flow through the chassis. Heat sinks are well understood in the art, and may be manufactured of a thermally conductive material (e.g., metal or metal alloys) configured to readily absorb heat in one area and dissipate the absorbed heat in another area. In an exemplary embodiment, the thermally conductive material is formed as a plurality of "fins," but other embodiments are also contemplated.

FIG. 2 is a schematic view of an exemplary remote exhaust system 200. The remote exhaust system 200 may include a plurality of chassis 101a-d (e.g., mounted in a rack system as described in more detail above with reference to FIG. 1). Branch lines 210 couple each of the individual chassis 101a-d to a main line 220. The branch lines 210 and main line 220 may be made of a bellow material to enable flexibility for ease of installation and configuration/reconfiguration.

At least one exhaust pump 230a-c is connected to the main line 220. The exhaust pump(s) 230a-c is operable to remove heat generated in each of the individual chassis 101a-d by drawing cooler air through the front (and optionally the sides) of chassis 101a-d and exhausting the heated air through the network of ducts 210, 220, e.g., as illustrated by arrow 240.

In an exemplary embodiment, the exhaust pump(s) 230a-c may be variable load exhaust pumps. Or for example, more than one exhaust pump may be implemented in series or parallel to handle varying loads. One or more control valves may also be provided. For example, a control valve 225 may be provided on the main line 220 and/or control valves 215a-d may be provided on the branch lines 210.

In exemplary embodiments, heat sensing device(s) may be implemented to monitor the heat being generated. Remote actuators may be provided to control operation of the exhaust pump(s) and/or operation of the control valves in response to feedback from the heat sensing device(s). During operation, firmware may operate the exhaust pump(s) at different speeds, shut off one or more of the exhaust pump(s) when not needed, or vary the settings for the control valves, to name only a few examples of operation.

For purposes of illustration, a single exhaust pump 230a (or lower setting on the exhaust pump) may be sufficient to remove heat during light operation, and secondary exhaust pump(s) 230b-c may only be needed when the heat being generated exceeds a heat-removal threshold. Such an implementation reduces energy use and noise when more pumps (or higher operating speeds) are not needed, but if more heat is generated, the secondary exhaust pump(s) may be implemented to more quickly and effectively remove heat without adversely affecting operation.

It is noted that although a particular configuration and number of components is shown in FIG. 2, any number of exhaust pumps 230a-c, main lines 220, and branch lines 210 may be implemented in any suitable configuration. The type and number of components and the configuration will depend on a variety of design characteristics, as will be readily appreciated by those having ordinary skill in the art after becoming familiar with the teachings herein.

FIG. 3 is a high-level schematic view illustrating various environments 300, 310, and 320 of an exemplary remote exhaust system 200. In exemplary embodiments, there are at least three separate environments for the remote exhaust system 200. The rack system environment 320 includes the chassis 101a-d and is the environment where heat is generated.

The exhaust environment 310 may be physically the same as the rack system environment 320. In other embodiments, however, the exhaust environment 310 is acoustically isolated from the rack system environment 320. For example, the exhaust environment 310 may be a separate insulated room so that noise from operation of the exhaust pump 230 can be minimized in the rack system environment.

The remote environment 300 may also be separate from the exhaust environment 310 (e.g., outdoors). Although the remote environment 300 and the exhaust environment 310 can be physically the same, the remote environment 300 is preferably thermally isolated from the rack system environment 320 so that heat being removed from the chassis 101a-d is not re-entrained in the air used to cool the chassis 101a-d.

In exemplary embodiments, the hot air removed from the chassis 101a-d may be delivered to a reuse facility 305 for recycling (e.g., by reincorporating the hot air into the building's heating system, heating water via heat-transfer mechanisms, etc.). Cladding may be provided on the ducting (e.g., main line 220 and branch lines 210) to preserve the heat in the air stream until it can be reused.

It is noted that the exemplary embodiments discussed above are provided for purposes of illustration. Still other embodiments are also contemplated. It is also noted that, although the systems and methods are described with reference to rack systems, in other exemplary embodiments, the remote exhaust may be implemented for other electronic devices, such as, a collection of peripheral devices for computers, video and audio equipment, etc.

In addition to the specific embodiments explicitly set forth herein, other aspects and embodiments will be apparent to those skilled in the art from consideration of the specification disclosed herein. It is intended that the specification and illustrated embodiments be considered as examples only.

The invention claimed is:

1. A remote exhaust for a rack system, comprising:
    branch lines coupling each of a plurality of individual chassis in the rack system to a main line;
    at least one exhaust pump connected to the main line, the exhaust pump located to remove heat generated in each of the individual chassis to a physically remote environment;
    a plurality of control valves configured to control air flow through the branch lines and the main line;
    at least one sensor; and
    firmware configured to operate the at least one exhaust pump and vary settings for the plurality of control valves in response to feedback from the at least one sensor; and
    wherein at least some hot air drawn by the exhaust pump is used in a regenerative lower stream function, the regenerative lower stream function is at least one of the following: a building heating system and a water heating system.

2. The remote exhaust of claim 1, further comprising an elastic heat resistant seal surrounding a back-end of each of the plurality the individual chassis.

3. The remote exhaust of claim 1, wherein the branch lines and main line are made of a flexible material for ease of configuration.

4. The remote exhaust of claim 1, further comprising an opening formed in a back-end of the individual chassis for accessing inside the individual chassis, and a hook-and-loop material cover for closing the opening.

5. The remote exhaust of claim 1, further comprising at least one secondary exhaust pump to handle changes in operating conditions.

6. The remote exhaust of claim 1, wherein the exhaust pump is operable at variable flow rates to handle changes in operating temperatures of the rack system.

7. The remote exhaust of claim 1, wherein the sensor is configured to monitor temperature of the rack system.

8. The remote exhaust of claim 1, wherein the exhaust pump draws air through a front-end of the chassis, past at least one heat-generating component in the chassis, and out a back-end of the chassis through the branch lines and main line to the remote environment.

9. The remote exhaust of claim 1, further comprising cladding on the main line and the branch lines to substantially maintain the temperature of air in the main line and the branch lines.

10. A method comprising:
    coupling branch lines to each of a plurality of chassis in a rack system;
    coupling the branch lines to at least one main line;
    connecting the main line to at least one exhaust pump to remove heat generated in each of the plurality of chassis to a physically remote environment;
    monitoring operating conditions of the rack system;
    varying the at least one exhaust pump and separately varying settings for airflow through the branch lines and the main line in response to different operating conditions; and
    insulating the at least one main line and the branch lines to substantially maintain the temperature of air being exhausted.

11. The method of claim 10, further comprising sealing the plurality of chassis in order to draw substantially all hot air from the plurality of chassis into the branch lines.

12. The method of claim 10, further comprising adjusting air flow for changes in operating temperatures.

13. The method of claim 10, further comprising recycling at least some hot air.

14. The method of claim 10, further comprising sensing temperature of at least one of the plurality of chassis and adjusting air flow based on the sensed temperature.

15. A remote exhaust for dissipating heat in computers or other electronic devices, comprising:
    branching means for coupling to each of a plurality of individual chassis;
    main line means for coupling to each of the branching means;
    exhaust pump means for removing hot air from each of the individual chassis through the branching means and main line means to a physically remote environment; and
    means for varying the exhaust pump means, and means for varying settings for airflow through the branching means and the main line means, in response to different operating conditions; and
    means for insulating the branching means and the main line means to reduce heat loss in air being exhausted.

16. The remote exhaust of claim 15 further comprising regenerative lower stream function means for recycling at least some of the hot air.

\* \* \* \* \*

UNITED STATES PATENT AND TRADEMARK OFFICE
CERTIFICATE OF CORRECTION

PATENT NO.        : 8,355,251 B2
APPLICATION NO.   : 12/195425
DATED             : January 15, 2013
INVENTOR(S)       : Soon Peng Jason Sim et al.

It is certified that error appears in the above-identified patent and that said Letters Patent is hereby corrected as shown below:

In the Claims

In column 4, line 63, in Claim 1, delete "system" and insert -- system, --, therefor.

In column 4, line 67, in Claim 2, delete "plurality the".

Signed and Sealed this
Twenty-fourth Day of September, 2013

Teresa Stanek Rea
*Deputy Director of the United States Patent and Trademark Office*